United States Patent
Shintani et al.

(10) Patent No.: US 7,727,811 B2
(45) Date of Patent: Jun. 1, 2010

(54) PRESSURE-SENSITIVE ADHESIVE SHEET FOR PROCESSING SEMICONDUCTOR WAFER OR SEMICONDUCTOR SUBSTRATE

(75) Inventors: Toshio Shintani, Ibaraki (JP); Fumiteru Asai, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 276 days.

(21) Appl. No.: 11/747,277

(22) Filed: May 11, 2007

(65) Prior Publication Data
US 2007/0264498 A1 Nov. 15, 2007

(30) Foreign Application Priority Data
May 12, 2006 (JP) .............................. 2006-133234

(51) Int. Cl.
*C08J 7/04* (2006.01)
*B29C 71/02* (2006.01)
*B32B 7/12* (2006.01)
*H01L 21/00* (2006.01)

(52) U.S. Cl. .................. 438/113; 522/117; 522/121; 428/343; 428/345; 428/355 AC

(58) Field of Classification Search ............... 522/121, 522/95, 96, 117; 428/345, 355 EN, 343, 428/355 AC; 438/113
See application file for complete search history.

(56) References Cited

U.S. PATENT DOCUMENTS 4,756,968 A * 7/1988 Ebe et al. ................. 428/343
5,955,512 A * 9/1999 Numazawa et al. .......... 522/95
6,461,728 B2 * 10/2002 Weiss et al. ................ 428/345
6,472,065 B1 * 10/2002 Alahapperuma et al. .... 428/343
6,759,121 B2 * 7/2004 Alahapperuma et al. .................... 428/355 AC
2005/0048241 A1 3/2005 Terada et al.

FOREIGN PATENT DOCUMENTS

| EP | 0 344 529 | A1 | 12/1989 |
| EP | 0 745 654 | A1 | 12/1996 |
| GB | 2 312 429 | A | 10/1997 |
| JP | 62-153376 | A | 7/1987 |
| JP | 6-49420 | A | 2/1994 |

* cited by examiner

*Primary Examiner*—Susan W Berman
(74) *Attorney, Agent, or Firm*—Sughrue Mion, PLLC

(57) ABSTRACT

The present invention relates to a pressure-sensitive adhesive sheet for processing a semiconductor wafer or semiconductor substrate, which includes a base material and a pressure-sensitive adhesive layer which is polymerizable and curable by an energy ray, the pressure-sensitive adhesive layer being disposed on a surface of the base material, in which the pressure-sensitive adhesive layer includes a base polymer, a multifunctional acrylate-based oligomer which has an energy-ray polymerizable carbon-carbon double bond and has a molecular weight of 1000 to 2500, and a multifunctional acrylate-based compound which has an energy-ray polymerizable carbon-carbon double bond and has a molecular weight of 200 to 700. The pressure-sensitive adhesive sheet of the invention is excellent in follow-up properties to a minute unevenness with a depth of about 0.4 to 40 μm such as a mark printed by laser irradiation, exhibits sufficient adhesive force, and can be released without the generation of adhesive residue after the purpose of adhesion has been achieved.

9 Claims, No Drawings

PRESSURE-SENSITIVE ADHESIVE SHEET FOR PROCESSING SEMICONDUCTOR WAFER OR SEMICONDUCTOR SUBSTRATE

FIELD OF THE INVENTION

The present invention relates to a pressure-sensitive adhesive sheet for processing electronic parts, and particularly to a pressure-sensitive adhesive sheet for processing a semiconductor wafer or semiconductor substrate, which is used when the semiconductor wafer or semiconductor substrate is cut.

BACKGROUND OF THE INVENTION

In the production of semiconductor wafers or semiconductor substrates, as pressure-sensitive adhesive sheets used for being adhered on semiconductor wafers or substrates, performing processing such as dicing and expanding, and then, picking up and simultaneously mounting the semiconductor wafers or semiconductor substrates, there have hitherto been proposed pressure-sensitive adhesive sheets including a base material having provided thereon a pressure-sensitive adhesive layer having the property of polymerizing by irradiation of ultraviolet rays or the like. In such pressure-sensitive adhesive sheets, the pressure-sensitive adhesive layers are allowed to undergo a polymerization curing reaction by irradiation of ultraviolet rays or the like after the purpose of adhesion has been achieved, thereby reducing adhesive force of the pressure-sensitive adhesive layers to be able to pick up the semiconductor wafers or semiconductor substrates. Specifically, for example, JP-A-6-49420 proposes a pressure-sensitive adhesive sheet for processing a semiconductor wafer, which includes a base material having transparency to ultraviolet rays and/or radiations and a pressure-sensitive adhesive layer that undergoes a polymerization curing reaction by ultraviolet rays and/or radiations, in which the pressure-sensitive adhesive layer includes a base polymer, a multifunctional urethane acrylate-based oligomer having a molecular weight of 15000 to 50000, a polyester-based plasticizer and a photopolymerization initiator, and the content of the polyester plasticizer is 1 to 50 parts by weight with respect to 100 parts by weight of the base polymer. Further, JP-A-62-153376 proposes a pressure-sensitive adhesive sheet including a base material having applied thereon a pressure-sensitive adhesive layer containing an adhesive and a radiation polymerizable compound, in which a multifunctional urethane acrylate oligomer having a molecular weight of about 3000 to 10000 is used as the radiation polymerizable compound.

Recently, however, there have increased wafers having marks with a depth of about 5 to 10 μm that are printed on surfaces thereof by laser irradiation. Further, also in semiconductor substrates, there have increased those having rough surfaces of about 0.4 to 15 μm on sealing resin surfaces acting as surfaces to which pressure-sensitive adhesive tapes are to be adhered, or substrates having marks with a depth of 25 to 40 μm that are printed in the same manner as with the wafers. In processing of such semiconductor wafers or semiconductor substrates having an extremely minute unevenness on their surfaces, the conventional pressure-sensitive adhesive sheets are not sufficient to follow up the unevenness on the surfaces to which the sheets are to be adhered, so that sufficient adhesive force cannot be obtained. As a result, when the wafers or substrates are cut, chips fly off to cause the occurrence of the defect of substantially decreasing the yield. Further, the chips that have flied off collide with a cutting blade to cause the occurrence of the defect of damaging the blade. Furthermore, the sheets are insufficient to follow up the unevenness, so that air bubbles are involved in depressed portions to cause the occurrence of poor curing of pressure-sensitive adhesive layers, and when the wafers or substrates are picked up after irradiation of radiations, there occurs the defect that residues of adhesives are partially observed.

Patent Document 1: JP-A-6-49420
Patent Document 2: JP-A-62-153376

SUMMARY OF THE INVENTION

An object of the invention is to provide a pressure-sensitive adhesive sheet for processing a semiconductor wafer or semiconductor substrate, which is excellent in follow-up properties to the unevenness, and well follows up printing by laser irradiation and also minute unevenness on an adherend surface to exhibit sufficient adhesive force in semiconductor wafer or semiconductor substrate processing.

Another object of the invention is to provide a pressure-sensitive adhesive sheet for processing a semiconductor wafer or semiconductor substrate, which can be well released without the generation of partial adhesive residue, because the entire pressure-sensitive adhesive layer is homogeneously polymerized and cured when an energy ray is irradiated after the purpose of adhesion has been achieved.

The present inventors have conducted intensive studies in order to solve the above-mentioned problems. As a result, the inventors found that a pressure-sensitive adhesive sheet exhibiting excellent follow-up properties to a minute uneven surface is obtainable by constituting a pressure-sensitive adhesive sheet by combining a base polymer, and a multifunctional acrylate-based oligomer and a multifunctional acrylate-based compound each having a specific molecular weight.

DETAILED DESCRIPTION OF THE INVENTION

Namely, the present invention relates to the followings.

(1) A pressure-sensitive adhesive sheet, which comprises:
a base material; and
a pressure-sensitive adhesive layer which is polymerizable and curable by an energy ray, said pressure-sensitive adhesive layer being disposed on a surface of the base material,
wherein the pressure-sensitive adhesive layer comprises:
a base polymer,
a multifunctional acrylate-based oligomer which has an energy-ray polymerizable carbon-carbon double bond and has a molecular weight of 1000 to 2500, and
a multifunctional acrylate-based compound which has an energy-ray polymerizable carbon-carbon double bond and has a molecular weight of 200 to 700.

(2) The pressure-sensitive adhesive sheet according to (1), which is for use in processing a semiconductor wafer or semiconductor substrate.

(3) The pressure-sensitive adhesive sheet according to (1), wherein the base polymer is an acrylic polymer, and
wherein said multifunctional acrylate-based oligomer is contained in an amount of 60 to 130 parts by weight, and said multifunctional acrylate-based compound is contained in an amount of 3 to 50 parts by weight, with respect to 100 parts by weight of the acrylic polymer.

(4) The pressure-sensitive adhesive sheet according to (3), wherein said multifunctional acrylate-based oligomer is contained in an amount of 80 to 110 parts by weight, and said multifunctional acrylate-based compound is contained in an amount of 5 to 30 parts by weight, with respect to 100 parts by weight of the acrylic polymer.

(5) The pressure-sensitive adhesive sheet according to (1), wherein the base polymer is an acrylic polymer having a weight-average molecular weight of from 300,000 to 1,000,000.

(6) The pressure-sensitive adhesive sheet according to (1), wherein the multifunctional acrylate-based oligomer is a urethane acrylate oligomer.

(7) The pressure-sensitive adhesive sheet according to (1), wherein the multifunctional acrylate-based compound is a multifunctional alkyl acrylate.

(8) The pressure-sensitive adhesive sheet according to (1), which is used for adhering to a surface of a semiconductor wafer or substrate having a depression with a depth of 0.4 to 40 μm and cutting the semiconductor wafer or substrate.

(9) A method for processing a semiconductor wafer or semiconductor substrate, which comprises:
adhering the pressure-sensitive adhesive sheet according to (1) to a surface of a semiconductor wafer or substrate; and
cutting the semiconductor wafer or substrate.

(10) The method according to (9), wherein the semiconductor wafer or substrate has a depression with a depth of 0.4 to 40 μm.

The pressure-sensitive adhesive layer in the invention preferably contains the multifunctional acrylate-based oligomer which has an energy-ray polymerizable carbon-carbon double bond and has a molecular weight of 1000 to 2500 in an amount of 60 to 130 parts by weight, and the multifunctional acrylate-based compound which has an energy-ray polymerizable carbon-carbon double bond and has a molecular weight of 200 to 700 in an amount of 3 to 50 parts by weight, with respect to 100 parts by weight of an acrylic polymer employed as the base polymer.

The pressure-sensitive adhesive sheet for processing a semiconductor wafer or semiconductor substrate of the invention can be used for adhering to a surface of a semiconductor wafer or substrate having a depression with a depth of 0.4 to 40 μm and cutting the semiconductor wafer or substrate.

The pressure-sensitive adhesive sheet for processing a semiconductor wafer or semiconductor substrate of the invention is excellent in follow-up properties to an unevenness on an adherend surface, exhibits sufficient adhesive force, and can be well released without the generation of adhesive residue, because it is polymerized and cured without the occurrence of polymerization irregularity to decrease the adhesive force when an energy ray is irradiated.

When a dicing operation of a semiconductor wafer or semiconductor substrate having a depression with a depth of 0.4 to 40 μm on a surface thereof is performed using the pressure-sensitive adhesive sheet for processing a semiconductor wafer or semiconductor substrate of the invention, the operation can be performed without the occurrence of the defect that chips fly off in dicing, and the sheet can be released without the generation of adhesive residue in picking up after the irradiation of the energy ray.

The pressure-sensitive adhesive sheet for processing a semiconductor wafer or semiconductor substrate of the present invention includes a base material having provided thereon a pressure-sensitive adhesive layer that undergoes a polymerization curing reaction by an energy ray, and after it is adhered to an adherend such as semiconductor wafer or substrate and the purpose of adhesion has been achieved, the pressure-sensitive adhesive is allowed to be polymerized and cured by irradiation of the energy ray thereby being able to reduce adhesive force of the pressure-sensitive adhesive layer. Although the energy ray as used in the invention includes all that can initiate and progress the polymerization curing reaction of the pressure-sensitive adhesive layer by irradiation, there can be exemplified, for example, ionizing radiations such as electron beams, α-rays, β-rays, γ-rays and neutrons; and nonionizing radiations such as ultraviolet rays. Among these, ultraviolet rays and electron beams can be preferably used from the viewpoint of productivity and the like.

Base Material

The base material that can be used in the pressure-sensitive adhesive sheet for processing a semiconductor wafer or semiconductor substrate of the invention is not particularly limited, and can be selected from conventional or commonly used base materials such as plastic base materials, metallic base materials, fibrous base materials and base materials made from paper, depending on the kind of energy ray used for the polymerization curing reaction of the pressure-sensitive adhesive layer after the purpose of adhesion has been achieved. For example, when the polymerization curing reaction of the pressure-sensitive adhesive layer is conducted by irradiation of an ultraviolet ray, a base material through which the ultraviolet ray can pass can be selected, and when the polymerization curing reaction of the pressure-sensitive adhesive layer is conducted by irradiation of an electron beam, a base material through which the electron beam can pass can be selected. Specifically, for example, a plastic film or sheet can be suitably used. Examples of the materials constituting the plastic film or sheet include polyolefinic resins (low-density polyethylene, straight-chain polyethylene, intermediate-density polyethylene, high-density polyethylene, ultralow-density polyethylene, random copolymerized polypropylene, block copolymerized polypropylene, homopolypropylene, polybutene, polymethylpentene and the like), ethylene-vinyl acetate copolymers, ionomer resins, ethylene-(meth)acrylic acid copolymers, ethylene-(meth)acrylate copolymers (a random copolymer, an alternate copolymer and the like), ethylene-butene copolymers, ethylene-hexene copolymers, polyurethanes, polyesteric resins (polyethylene terephthalate, polyethylene naphthalate, polybutylene terephthalate, polybutylene naphthalate and the like), polyimides, polyamides, polyetherketones, polyethers, polyethersulfones, polystyreneic resins (polystyrene and the like), polyvinyl chloride, polyvinylidene chloride, polyvinyl alcohol, polyvinyl acetate, vinyl chloride-vinyl acetate copolymers, polycarbonates, fluororesins, cellulosic resins and crosslinked product of these resins. These materials may be used either solely or as a combination of two or more thereof.

A surface of the base material may be subjected to conventional or commonly used surface treatments (for example, treatments such as a corona discharge treatment, a chromic acid treatment, an ozone exposure treatment, a flame exposure treatment, a high-voltage shock exposure treatment and an ionizing radiation treatment, and a crosslinking treatment), for the purpose of imparting adhesion with or holding properties on the pressure-sensitive adhesive layer. Further, in order to impart an antistatic function, a base material on which a vapor-deposited layer formed by a conductive material such as a metal, an alloy or an oxide thereof may be used.

The base material may have either a monolayer form or a laminated form. Further, a conventional additive such as a filler, a flame retardant, an antiaging agent, an antistatic agent, a softening agent, an ultraviolet absorber, an antioxidant, a plasticizer or a surfactant may be contained in the base material according to the necessity.

A forming method of the base material is not particularly limited, and can be employed by appropriately selecting it from conventional or commonly used forming methods.

Examples of the forming methods of the plastic base materials include a calender film forming method, a casting film forming method, an inflation extrusion method and a T-die extrusion method. Further, the plastic base material having a constitution in which multiple layers are laminated can be formed by utilizing a laminating method such as a co-extrusion method or a dry lamination method. The plastic base material may be either in an undrawn state or in a state in which it is uniaxially or biaxially drawn by a drawing treatment.

The thickness of the base material is not particularly limited, and can be appropriately determined. For example, it can be selected from the range of 5 to 1000 μm, preferably about 25 to 250 μm.

Pressure-Sensitive Adhesive Layer

In the invention, the pressure-sensitive adhesive layer can be formed by forming on the substrate in layer form a pressure-sensitive adhesive composition containing a base polymer, a multifunctional acrylate-based oligomer which has an energy-ray polymerizable carbon-carbon double bond and has a molecular weight of 1000 to 2500 (hereinafter simply referred to as a multifunctional acrylate-based oligomer in some cases), and a multifunctional acrylate-based compound which has an energy-ray polymerizable carbon-carbon double bond and has a molecular weight of 200 to 700 (hereinafter simply referred to as a multifunctional acrylate-based compound in some cases).

Base Polymer

As the above-mentioned base polymer, there can be used a conventional polymer having adhesive characteristics, and it is not particularly limited. Example thereof include a rubber-based polymer and an acrylic polymer. Examples of the rubber-based polymers include natural rubber and synthetic rubber such as butyl rubber, butadiene rubber, isoprene rubber, styrene-isoprene-styrene rubber, styrene-ethylene/butylene-styrene rubber, styrene-ethylene/propylene-styrene rubber and styrene-butadiene-styrene rubber. Examples of the acrylic polymers include an acrylic copolymer containing a (meth)acrylic ester as a main component and an unsaturated monomer copolymerizable therewith as a monomer component. The base polymers can be used by appropriately selecting one or two or more thereof, and are not particularly limited. However, acrylic polymers can be suitably used, and particularly, an acrylic polymer having a weight molecular weight of 300000 to 1000000 can be suitably used.

In the above-mentioned acrylic polymers containing the (meth)acrylic ester as a main component, examples of the (meth)acrylic esters, contained as the main component, include alkyl(meth)acrylates such as methyl(meth)acrylate, ethyl(meth)acrylate, propyl(meth)acrylate, isopropyl(meth)acrylate, butyl(meth)acrylate, isobutyl(meth)acrylate, s-butyl(meth)acrylate, t-butyl(meth)acrylate, pentyl(meth)acrylate, hexyl(meth)acrylate, heptyl(meth)acrylate, octyl(meth)acrylate, isooctyl(meth)acrylate, 2-ethylhexyl(meth)acrylate, nonyl(meth)acrylate, isononyl(meth)acrylate, decyl(meth)acrylate, isodecyl(meth)acrylate, undecyl(meth)acrylate, dodecyl(meth)acrylate, tridecyl(meth)acrylate, tetradecyl(meth)acrylate, pentadecyl(meth)acrylate, hexadecyl(meth)acrylate, heptadecyl(meth)acrylate and octadecyl(meth)acrylate; cycloalkyl(meth)acrylates such as cyclohexyl(meth)acrylate; and aryl(meth)acrylates such as phenyl(meth)acrylate. As the (meth)acrylic esters, there can be suitably used alkyl(meth)acrylates such as methyl(meth)acrylate and 2-ethylhexyl(meth)acrylate.

In order to improve characteristics such as cohesive force, a monomer copolymerizable with the (meth)acrylic ester (a copolymerizable monomer) may be optionally used as a monomer component in the acrylic polymer. The copolymerizable monomers can be used either solely or as a combination of two or more thereof. Examples of such copolymerizable monomers include monomers having a nitrogen atom-containing ring such as N-vinyl-2-pyrrolidone, N-methylvinylpyrrolidone, N-vinylpyridine, N-vinylpiperidone, N-vinylpyrimidine, N-vinylpiperazine, N-vinylpyrrole, N-vinylimidazole, N-vinyloxazole, N-vinylmorpholine, N-vinylcaprolactam, and N-(meth)acryloylmorpholine, as well as carboxyl group-containing monomers such as (meth)acrylic acid (acrylic acid or methacrylic acid), carboxyethyl(meth)acrylate, carboxypentyl(meth)acrylate, itaconic acid, maleic acid, fumaric acid, crotonic acid and isocrotonic acid; acid anhydride group-containing monomers such as maleic anhydride and itaconic anhydride; hydroxyl group-containing monomers such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, (4-hydroxymethylcyclohexyl)methyl(meth)acrylate, vinyl alcohol, allyl alcohol, 2-hydroxyethyl vinyl ether, 2-hydroxypropyl vinyl ether, 4-hydroxybutyl vinyl ether, propylene glycol monovinyl ether and dipropylene glycol monovinyl ether; sulfonic acid group-containing monomers such as styrenesulfonic acid, (meth)acrylamide propanesulfonic acid, sulfopropyl(meth)acrylate and (meth)acryloyloxynaphthalenesulfonic acid; phosphoric acid group-containing monomers such as 2-hydroxyethylacryloyl phosphate; amide-based monomers such as (meth)acrylamide, N,N-dimethyl(meth)acrylamide, N-butyl(meth)acrylamide, N-methylol(meth)acrylamide, or N-methylolpropane(meth)acrylamide and N-butoxymethyl(meth)acrylamide; cyano group-containing monomers such as (meth)acrylonitrile; olefinic monomers such as ethylene, propylene, isoprene, butadiene and isobutylene; styrenic monomers such as styrene, α-methylstyrene and vinyltoluene; vinyl ester-based monomers such as vinyl acetate and vinyl propionate; halogen atom-containing monomers such as vinyl chloride and vinylidene chloride; and isocyanate group-containing monomers such as (meth)acryloyl isocyanate, (meth)acryloyloxymethyl isocyanate, 2-(meth)acryloyloxyethyl isocyanate, 2-(meth)acryloyloxypropyl isocyanate, 3-(meth)acryloyloxypropyl isocyanate, 4-(meth)acryloyloxybutyl isocyanate and m-propenyl-α,α-dimethylbenzyl isocyanate. Among these, carboxyl group-containing monomers and acid anhydride group-containing monomers can be suitably used.

Further, for the purpose of crosslinking, a multifunctional monomer can also be optionally used as the copolymerizable monomer. Examples of such multifunctional monomers include 1,6-hexanediol(meth)acrylate, (poly)ethylene glycol di(meth)acrylate, (poly)propylene glycol di(meth)acrylate, neopentyl glycol di(meth)acrylate, pentaerythritol di(meth)acrylate, trimethylolpropane tri(meth)acrylate, pentaerythritol(meth)acrylate, dipentaerythritol hexa(meth)acrylate, polyester(meth)acrylate, urethane(meth)acrylate, divinylbenzene, dibutyl(meth)acrylate and hexyl di(meth)acrylate.

The amount (rate) of the copolymerizable monomer used is preferably 40% by weight or less based on the total amount of the monomer components. When the carboxyl group-containing monomer or the acid anhydride group-containing monomer is used as the copolymerizable monomer, the amount thereof used is preferably selected, for example, from the range of 1 to 30% by weight, and particularly from the range of 2 to 20% by weight, based on the total amount of the monomer components. When the multifunctional monomer is used as the copolymerizable monomer, the amount of the multifunctional monomer used is preferably 30% by weight or less based on the total amount of the monomer components, from the viewpoint of adhesive characteristics.

The acrylic polymer can be prepared by subjecting a single monomer component or a mixture of two or more monomer components to polymerization. The polymerization can also be carried out by a polymerization system such as a solution polymerization process, an emulsion polymerization process, a bulk polymerization process or a suspension polymerization process.

Multifunctional Acrylate-Based Oligomer

In the invention, the pressure-sensitive adhesive layer contains a multifunctional acrylate-based oligomer which has an energy-ray polymerizable carbon-carbon double bond and has a molecular weight of 1000 to 2500 and a multifunctional acrylate-based compound which has an energy-ray polymerizable carbon-carbon double bond and has a molecular weight of 200 to 700. Since the pressure-sensitive adhesive layer contains the multifunctional acrylate-based oligomer and the multifunctional acrylate-based compound, the pressure-sensitive adhesive sheet excellent in follow-up properties and adhesive force to a surface to which the sheet is to be adhered, particularly excellent in follow-up properties to a minute unevenness with a depth of about 0.4 to 40 μm, can be obtained. Further, when an energy ray is irradiated, polymerization irregularity does not occur in an uneven portion such as a printed portion of the semiconductor wafer, because of its excellent follow-up properties to the surface to which the sheet is to be adhered, and the polymerization curing reaction homogeneously proceeds. Accordingly, the sheet can be well released from an adherend without the generation of adhesive residue on the adherend. When the pressure-sensitive adhesive layer does not contain either of the multifunctional acrylate-based oligomer and the multifunctional acrylate-based compound or both of them, there occur the problems of insufficient adhesive force and cohesive force, an insufficient decrease in adhesive force after curing and difficulty in picking up chips. For example, when the pressure-sensitive adhesive layer contains only the above-mentioned multifunctional acrylate-based oligomer, following up to the unevenness on the adherend surface becomes insufficient, which causes the chips to fly off or a blade to be damaged at the time of cutting the wafer or the like. Additionally, embedding of the pressure-sensitive adhesive in a depressed portion becomes insufficient, so that poor curing occurs in that portion, resulting in the occurrence of the problem of the generation of adhesive residue on the adherend surface in releasing. On the other hand, when the pressure-sensitive adhesive layer contains only the above-mentioned multifunctional acrylate-based compound and does not contain the above-mentioned multifunctional acrylate-based oligomer, the pressure-sensitive adhesive follows up extremely well to the uneven portion in consequence, resulting in the generation of adhesive residue in the laser-printed portion. Further, the pressure-sensitive adhesive after UV irradiation is extremely brittle, and accordingly, even when no adhesive residue is generated, the adhesive is cracked to form a deposit when the tape is released from the substrate, which poses the problem of contaminating the substrate.

As the above-mentioned multifunctional acrylate-based oligomer, there can be used, for example, any of oligomers such as an epoxy acrylate oligomer, a urethane acrylate oligomer and a polyester acrylate oligomer, which contains two or more energy-ray polymerizable carbon-carbon double bonds in the molecule thereof and has a molecular weight within a range of from 1000 to 2500, and it is not particularly limited. The energy-ray polymerizable carbon-carbon double bonds are preferably contained as (meth)acryloyl groups. The acrylate-based oligomer having 2 to 4 (meth)acryloyl groups in the molecule thereof can be suitably used, and the acrylate-based oligomer having 2 (meth)acryloyl groups in the molecule thereof can be most suitably used.

It is preferred that the urethane acrylate oligomer is used as the above-mentioned multifunctional acrylate-based oligomer. Specifically, there can be exemplified, for example, an oligomer containing a diisocyanate compound, a polyol compound and a hydroxyl group-containing alkyl(meth)acrylate compound as monomer components. Examples of the above-mentioned diisocyanate compounds include toluene diisocyanate, diphenylmethane diisocyanate, hexamethylene diisocyanate, phenylene diisocyanate, dicyclohexylmethane diisocyanate, xylene diisocyanate, tetramethylxylene diisocyanate, naphthalene diisocyanate and isophorone diisocyanate. The diisocyanate compounds can be used by selecting one or two or more thereof. Examples of the above-mentioned polyol compounds include polyhydric alcohols such as ethylene glycol, 1,4-butanediol, 1,6-hexanediol, diethylene glycol, trimethylolpropane, dipropylene glycol, polyethylene glycol, polypropylene glycol, pentaerythritol, dipentaerythritol and glycerol; polyester-based polyol compounds obtained by a condensation reaction of the above-mentioned polyhydric alcohols with aliphatic dicarboxylic acids such as adipic acid, sebacic acid, azelaic acid and maleic acid, or with aromatic dicarboxylic acids such as terephthalic acid and isophthalic acid; polyether-based polyol compounds such as polyethylene ether glycol, polypropylene ether glycol, polytetramethylene ether glycol and polyhexamethylene ether glycol; lactone-based polyol compounds such as polycaprolactone glycol, polypropiolactone glycol and polyvalerolactone glycol; and polycarbonate-based polyol compounds obtained by the dealcoholization reaction of polyhydric alcohols such as ethylene glycol, propylene glycol, butanediol, pentanediol, octanediol and nonanediol with carbonates such as diethylene carbonate and dipropylene carbonate. The polyol compounds can be used by selecting one or two or more thereof. Examples of the hydroxyl group-containing alkyl(meth)acrylate compounds include 2-hydroxyethyl (meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate and (4-hydroxymethylcyclohexyl)methyl(meth)acrylate. The hydroxyl group-containing alkyl(meth)acrylate compounds can be used by selecting one or two or more thereof.

The urethane acrylate oligomer can be prepared, for example, by reacting the above-mentioned diisocyanate compound and polyol compound in a reaction vessel maintained at 60 to 90° C., adding the hydroxyl group-containing alkyl (meth)acrylate after the completion of the reaction, and further conducting the reaction.

The urethane acrylate oligomer may contain, as monomer components, for example, a multifunctional acrylate compound such as trimethylolpropane triacrylate, pentaerythritol triacrylate, pentaerythritol tetraacrylate dipentaerythritol monohydroxypentaacrylate and dipentaerythritol hexaacrylate, in addition to the above-mentioned polyol component, diisocyanatate component and hydroxyl group-containing alkyl(meth)acrylate component. The multifunctional acrylate-based oligomers can be used by selecting one or two or more thereof.

Multifunctional Acrylate-Based Compound

As the multifunctional acrylate-based compound, there can be used a compound having two or more energy-ray polymerizable carbon-carbon double bonds in the molecule thereof and a (meth)acryloyl group, and having a molecular weight within a range of from 200 to 700. In addition, the energy-ray polymerizable carbon-carbon double bonds may be contained either only as the (meth)acryloyl groups or as a combination of the (meth)acryloyl group and another group (for example, a vinyl group or the like). Further, it may be a compound having repetition of structural units so long as the molecular weight thereof is 700 or less. For example, there can be exemplified a multifunctional alkyl acrylate, a multifunctional polyester (meth)acrylate, a multifunctional polyurethane(meth)acrylate and a multifunctional acrylate compound having oxyalkylene repeating units.

Specific examples of the multifunctional alkyl acrylates include (meth)acrylates of straight-chain aliphatic polyols such as 1,5-pentanediol(meth)acrylate, 1,6-hexanediol (meth)acrylate, 1,9-nonanediol(meth)acrylate, polyethylene glycol(meth)acrylate and polypropylene glycol(meth)acrylate; (meth)acrylates of alicyclic group-containing aliphatic polyols such as cyclohexanedimethanol di(meth)acrylate and tricyclodecanedimethanol diacrylate; and (meth)acrylates of branched aliphatic polyols such as trimethylolpropane tri (meth)acrylate, pentaerythritol tri(meth)acrylate, pentaerythritol tetra(meth)acrylate and condensates thereof (such as ditrimethylolpropane tetraacrylate and dipentaerythritol hexaacrylate).

The multifunctional polyester (meth)acrylate is a compound obtained by (meth)acrylating a polyester compound having a plurality of hydroxyl groups, which is obtained by a reaction of a polyhydric alcohol with a polybasic acid. Examples of the polyhydric alcohols include ethylene glycol, 1,4-butanediol, 1,6-hexanediol, diethylene glycol, trimethylolpropane, dipropylene glycol, polyethylene glycol, polypropylene glycol, pentaerythritol and dipentaerythritol. Examples of the polybasic acids include phthalic acid, adipic acid, maleic acid, trimellitic acid, itaconic acid, succinic acid and terephthalic acid. Examples of the multifunctional polyester (meth)acrylate also includes a (meth)acrylic ester of an ester compound obtained by a reaction of a hydroxyl group-containing carboxylic acid with a polyhydric alcohol, such as hydroxypivalic ester neopentyl glycol di(meth)acrylate.

As the multifunctional polyurethane(meth)acrylate, there can be used one that is similar to the above-mentioned urethane acrylate-based oligomer and has a molecular weight within a range of from 200 to 700.

Examples of the multifunctional acrylate-based compounds having oxyalkylene repeating units include di(meth)acrylate compounds of polyoxyalkylenes having hydroxyl groups at both ends, such as polyoxyethylene di(meth)acrylate and polyoxypropylene di(meth)acrylate; (meth)acrylates of oxyalkylenated aliphatic polyols such as ethylene oxide-modified cyclohexanedimethanol di(meth)acrylate, polyethylene oxide-modified cyclohexanedimethanol di(meth)acrylate, ethylene oxide-modified tricyclodecanedimethanol di(meth)acrylate, polyethylene oxide-modified tricyclodecanedimethanol di(meth)acrylate and ethylene oxide-modified trimethylolpropane tri(meth)acrylate; (meth)acrylates of oxyalkylenated aromatic polyols such as ethylene oxide-modified bisphenol A di(meth)acrylate and polyethylene oxide-modified bisphenol A di(meth)acrylate; and heterocyclic ring-containing alkylene oxide-modified (meth)acrylate compounds such as ethylene oxide-modified isocyanuric acid di(meth)acrylate and ethylene oxide-modified isocyanuric acid tri(meth)acrylate.

The multifunctional acrylate-based compounds can be used by appropriately selecting one or two or more thereof, and are not particularly limited. However, multifunctional alkyl acrylates can be preferably used, and (meth)acrylates of straight-chain aliphatic polyols can be particularly preferably used.

The pressure-sensitive adhesive composition for forming the pressure-sensitive adhesive layer in the invention can be prepared by mixing the multifunctional acrylate-based oligomer and the multifunctional acrylate-based compound with the above-mentioned base polymer. Although the mixing ratios of the multifunctional acrylate-based oligomer and the multifunctional acrylate-based compound to the base polymer are not particularly limited, for example, the ratio of the multifunctional acrylate-based oligomer can be selected within a range of from 60 to 130 parts by weight, and the ratio of the multifunctional acrylate-based compound can be selected within a range of from 3 to 50 parts by weight, with respect to 100 parts by weight of the base polymer. More preferably, the ratio of the multifunctional acrylate-based oligomer can be selected within a range of from 80 to 110 parts by weight, and the ratio of the multifunctional acrylate-based compound can be selected within a range of from 5 to 30 parts by weight, with respect to 100 parts by weight of the base polymer. When the ratios of the multifunctional acrylate-based oligomer and the multifunctional acrylate-based compound to the base polymer are outside the above-mentioned ranges, there unfavorably occur the problems of insufficient follow-up properties to an unevenness and an insufficient decrease in adhesive force when an energy ray is irradiated.

The ratio of the multifunctional acrylate-based oligomer to the multifunctional acrylate-based compound (the former/the latter ratio) is preferably selected from the range of 2/1 to 20/1, and more preferably selected from the range of 3/1 to 10/1. When the ratio of the multifunctional acrylate-based oligomer to the multifunctional acrylate-based compound is outside the above-mentioned range, there occur the problems of insufficient follow-up properties to an unevenness and an insufficient decrease in adhesive force when an energy ray is irradiated, in some cases.

The pressure-sensitive adhesive constituting the pressure-sensitive adhesive layer may optionally contain a photopolymerization initiator. The photopolymerization initiator is excited and activated by irradiation of an energy ray to form a radical, thereby accelerating an efficient polymerization curing reaction of the pressure-sensitive adhesive layer. Examples of the photopolymerization initiators include $\alpha$-ketol-based compounds (such as 2-methyl-2-hydroxypropiophenone), aromatic sulfonyl chloride-based compounds (such as 2-naphthalenesulfonyl chloride), photoactive oxime compounds (such as 1-phenone-1,1-propanedione-2-(o-ethoxycarbonyl)oxime), camphorquinones, halogenated ketones, acyl phosphinoxides and acyl phosphonates, as well as benzoin alkyl ether-based initiators such as benzoin methyl ether, benzoin ethyl ether, benzoin isopropyl ether and benzoin isopropyl ether; benzophenone-based initiators such as benzophenone, benzoylbenzoic acid, 3,3'-dimethyl-4-methoxybenzophenone and polyvinylbenzophenone; aromatic ketone-based initiators such as $\alpha$-hydroxycyclohexyl phenyl ketone, 4-(2-hydroxyethoxy)phenyl(2-hydroxy-2-propyl) ketone, $\alpha$-hydroxy-$\alpha,\alpha'$-dimethylacetophenone, methoxyacetophenone, 2,2-dimethoxy-2-phenylacetophenone and 2,2-diethoxyacetophenone; aromatic ketal-based initiators such as benzyl dimethyl ketal; thioxanthone-based initiators such as thioxanthone, 2-chlorothioxanthone, 2-methylthioxanthone, 2-ethylthioxanthone, 2-isopropylthioxanthone, 2-dodecylthioxanthone, 2,4-dichlorothioxanthone, 2,4-dimethylthioxanthone, 2,4-diethylthioxanthone and 2,4-diisopropylthioxanthone; and benzyl-based initiators such as benzyl. The photopolymerization initiators can be used either solely or as a combination of two or more thereof.

The compounding ratio of the photopolymerization initiator may be appropriately selected depending on the kind of photopolymerization initiator, the kinds of multifunctional acrylate-based oligomer and multifunctional acrylate-based compound, and the compounding amounts thereof, and is not particularly limited. However, it can be selected, for example, within a range of 0.1 to 15 parts by weight, and preferably within a range of 0.5 to 10 parts by weight, with respect to 100 parts by weight of the total amount of the multifunctional acrylate-based oligomer and multifunctional acrylate-based compound. When the compounding ratio of the photopolymerization initiator is less than 0.1 part by weight, a decrease in adhesive force of the pressure-sensitive adhesive layer by the polymerization curing reaction at the time when an energy ray is irradiated becomes insufficient in some cases. When the compounding ratio of the photopolymerization initiator exceeds 15 parts by weight, it unfavorably results in deterioration of stability against heat or fluorescent lighting in some cases.

For the purpose of improving cohesive force, the pressure-sensitive adhesive layer may contain a crosslinking agent. The crosslinking agent is not particularly limited, and can be used by appropriately selecting it from conventional or commonly used crosslinking agents (for example, an isocyanate-based crosslinking agent, an epoxy-based crosslinking agent, an oxazoline-based crosslinking agent, an aziridine-based crosslinking agent, a melamine-based crosslinking agent, a peroxide-based crosslinking agent, a urea-based crosslinking agent, a metal alkoxide-based crosslinking agent, a metal chelate-based crosslinking agent, a metal salt-based crosslinking agent, a carbodiimide-based crosslinking agent and an amine-based crosslinking agent). The crosslinking agents may be used either solely or as a mixture of two or more thereof. The compounding ratio of the crosslinking agent to be incorporated is not particularly limited, but can be selected, for example, within a range of 0.01 to 10 parts by weight, and preferably within a range of 0.05 to 5 parts by weight, with respect to 100 parts by weight of the base polymer.

The pressure-sensitive adhesive may further contain a conventional additive such as a tackifier, a filler, a flame retardant, an antiaging agent, an antistatic agent, a softening agent, an ultraviolet absorber, an antioxidant, a plasticizer, a surfactant or a coloring agent.

The pressure-sensitive adhesive layer can be formed by forming, on the base material in layer form, the above-mentioned pressure-sensitive adhesive composition containing the base polymer, the multifunctional acrylate-based oligomer and the multifunctional acrylate-based compound, utilizing any conventional appropriate method. The pressure-sensitive adhesive composition may be dissolved in an appropriate organic solvent to adjust its viscosity or the like to a state suitable for forming. The pressure-sensitive adhesive layer can be formed in layer form, for example, by applying or spraying the above-mentioned pressure-sensitive adhesive composition onto the base material, or applying the composition onto an appropriate separator (for example, a plastic film or sheet coated with a releasing agent) to form a pressure-sensitive adhesive layer, and then, transferring the resulting pressure-sensitive adhesive layer to the base material. The pressure-sensitive adhesive layer formed on the base material (or the separator) may be optionally dried by heating, for example, at 80 to 130° C. for about 30 seconds to about 10 minutes.

Although the thickness of the pressure-sensitive adhesive layer is not particularly limited, it can be selected, for example, from the range of 1 to 50 μm, and preferably from the range of 3 to 35 μm.

In the pressure-sensitive adhesive sheet for processing a semiconductor wafer or semiconductor substrate of the invention, a pressure-sensitive adhesive surface of the pressure-sensitive adhesive layer may be protected with a separator or the like according to the necessity. The separator is not particularly limited, and can be used by appropriately selecting it from conventional separators. Examples of the separators include base materials made from paper and films of synthetic resins such as polyethylene, polypropylene and polyethylene terephthalate. Further, in order to enhance releasability from the pressure-sensitive adhesive layer, a release treatment (mold release treatment) such as a silicone treatment, long-chain alkyl treatment or a fluorine treatment may be applied to a surface of the separator according to the necessity. The pressure-sensitive adhesive sheet for processing a semiconductor wafer or semiconductor substrate of the invention may be in a roll form or in the form of a laminate of sheets.

The pressure-sensitive adhesive sheet for processing a semiconductor wafer or semiconductor substrate of the invention, which can be obtained as described above, can be widely used as a processing sheet that is adhered to various adherends such as electronic parts and is released therefrom after a processing operation has been performed, and the application thereof is not particularly limited. In particular, it can be suitably used as a processing sheet used when adhering and cutting are performed to a semiconductor wafer or substrate surface having a depression with a depth of 0.4 to 40 μm. More particularly, it can be suitably used as a pressure-sensitive adhesive sheet for processing a semiconductor wafer or semiconductor substrate for conducting picking up after adhering and cutting (dicing) processing have been performed to a wafer or substrate having a mark with a depth of about 5 to 10 μm that is printed on a surface thereof by laser irradiation and a rough surface with a depth of about 0.4 to 15 μm on a sealing resin surface acting as a surface to which the pressure-sensitive adhesive sheet is to be adhered, or having a mark with a depth of 25 to 40 μm that is printed on the surface thereof by laser irradiation.

The cutting (dicing) process is performed for cutting a material to be processed, which is adhered to the pressure-sensitive adhesive sheet for processing a semiconductor wafer or semiconductor substrate, with a rotary round blade to element bits (chips) to form individual pieces, thereby producing cut pieces of the material to be processed. The pressure-sensitive adhesive sheet for processing a semiconductor wafer or semiconductor substrate of the invention well follows up to the minute unevenness as described above and exhibits sufficient adhesive force, so that the defect of flying off of the chips (cut pieces) does not occur in the cutting process, and the operation can be performed comfortably and efficiently.

The pick-up process is performed for radially expanding the cut pieces of the material to be processed that are adhered to the pressure-sensitive adhesive sheet for processing a semiconductor wafer or semiconductor substrate, and then, releasing the cut pieces therefrom to conduct picking up. A method of picking up in this case is not particularly limited, and various conventional pick-up methods can be employed. Examples thereof include a method of pushing up the individual cut pieces with needles from the side of the pressure-sensitive adhesive sheet for processing a semiconductor wafer or semiconductor substrate, and picking up the pushedup cut pieces with a pick-up device. The picking up is conducted after adhesive force of the pressure-sensitive adhesive layer has been decreased by irradiation of an energy ray. The energy rays to be irradiated include α-rays, β-rays, γ-rays, neutrons, electron beams and ultraviolet rays. Various conditions such as intensity and irradiation time of the energy ray are not particularly limited, and can be appropriately set according to the necessity. The pressure-sensitive adhesive sheet for processing a semiconductor wafer or semiconductor substrate of the invention well follows up to the minute unevenness, and air bubbles are not involved in depressed portions. Accordingly, when the energy ray is irradiated, the pressure-sensitive adhesive layer is homogeneously polymerized and cured without the occurrence of partial poor curing, resulting in no occurrence of the defect of generating an adhesive residue on the adherend surface.

EXAMPLES

The present invention will be illustrated in greater detail with reference to the following examples, but the invention should not be construed as being limited thereto.

Example 1

A pressure-sensitive adhesive composition obtained by blending 100 parts by weight of a copolymer (solid concentration: 35% by weight) which has a weight average molecular weight of 800,000 and was obtained by copolymerizing 20 parts by weight of methyl acrylate, 10 parts by weight of acrylic acid and 80 parts by weight of 2-ethylhexyl acrylate; 100 parts by weight of an oligomer mixture ("DPHA-40H" manufactured by Nippon Kayaku Co., Ltd.) containing a multifunctional acrylate-based compound with a molecular weight of 200 to 700 and a multifunctional acrylate-based oligomer with a molecular weight of 1000 to 2500; and 3 parts by weight of an photopolymerization initiator (Irgacure 651 manufactured by Ciba Specialty Chemicals) was applied onto a 38-μm thick polyester film subjected to a silicone release treatment to have a dry thickness of 20 μm, followed by drying at 120° C. for 5 minutes to form a pressure-sensitive adhesive layer.

A 150-μm thick polyethylene film acting as a base material was laminated on the pressure-sensitive adhesive layer, followed by aging at 50° C. for 4 days to obtain a pressure-sensitive adhesive sheet for processing a semiconductor wafer or semiconductor substrate.

Example 2

A pressure-sensitive adhesive composition obtained by blending 100 parts by weight of a copolymer (solid concentration: 35% by weight) which has a weight average molecular weight of 800,000 and was obtained by copolymerizing 20 parts by weight of methyl acrylate, 10 parts by weight of acrylic acid and 80 parts by weight of 2-ethylhexyl acrylate; 15 parts by weight of a multifunctional acrylate-based compound with a molecular weight of 330 ("NK Ester 4G" manufactured by Shin-Nakamura Chemical Co., Ltd.); 100 parts by weight of a multifunctional acrylate-based oligomer with a molecular weight of 1000 to 2500 ("UV-1700B" manufactured by Nippon Synthetic Chemical Industry Co., Ltd.); and 3 parts by weight of an photopolymerization initiator (Irgacure 651 manufactured by Ciba Specialty Chemicals) was applied onto a 38-μm thick polyester film subjected to a silicone release treatment to have a dry thickness of 20 μm, followed by drying at 120° C. for 5 minutes to form a pressure-sensitive adhesive layer.

A 150-μm thick polyethylene film acting as a base material was laminated on the pressure-sensitive adhesive layer, followed by aging at 50° C. for 4 days to obtain a pressure-sensitive adhesive sheet for processing a semiconductor wafer or semiconductor substrate.

Comparative Example 1

A pressure-sensitive adhesive sheet for processing a semiconductor wafer or semiconductor substrate was prepared in the same manner as in Example 2 with the exception that the multifunctional acrylate-based compound with a molecular weight of 330 ("NK Ester 4G" manufactured by Shin-Nakamura Chemical Co., Ltd.) was not used.

Comparative Example 2

A pressure-sensitive adhesive composition obtained by blending 100 parts by weight of a copolymer (solid concentration: 35% by weight) which has a weight average molecular weight of 800,000 and is obtained by copolymerizing 20 parts by weight of methyl acrylate, 10 parts by weight of acrylic acid and 80 parts by weight of 2-ethylhexyl acrylate; 100 parts by weight of a multifunctional acrylate-based oligomer with a molecular weight of 1000 to 2500 ("UV-1700B" manufactured by Nippon Synthetic Chemical Industry Co., Ltd.); 15 parts by weight of a multifunctional acrylate-based compound with a molecular weight of 1136 ("NK Ester 23G" manufactured by Shin-Nakamura Chemical Co., Ltd.); and 3 parts by weight of an photopolymerization initiator (Irgacure 651 manufactured by Ciba Specialty Chemicals) was applied onto a 38-μm thick polyester film subjected to a silicone release treatment to have a dry thickness of 20 μm, followed by drying at 120° C. for 5 minutes to form a pressure-sensitive adhesive layer.

A 150-μm thick polyethylene film acting as a base material was laminated on the pressure-sensitive adhesive layer, followed by aging at 50° C. for 4 days to obtain a pressure-sensitive adhesive sheet for processing a semiconductor wafer or semiconductor substrate.

Test Evaluations

For the pressure-sensitive adhesive sheets for processing a semiconductor wafer or semiconductor substrate that were obtained in Examples and Comparative Examples, the following evaluations were made.

<Unevenness Follow-Up Properties>

The pressure-sensitive adhesive sheet was adhered to a sealing resin surface (surface roughness: 8 μm, laser print depth: 25 μm) of a substrate in which semiconductor chips were embedded, at a speed of 60 mm/sec at a table temperature of 23° C. using an "M-286N" sticking apparatus manufactured by Nitto Seiki Co., Ltd. Using an optical microscope, unevenness follow-up properties to a rough surface and laser-printed portion of the sealing resin surface were observed. When the follow-up properties to the unevenness were good, and no air bubble involved in depressed portion was observed, it was evaluated as "good". When the follow-up properties to the unevenness were insufficient, and air bubbles involved in depressed portion were observed, it was evaluated as "insufficient". The results thereof are shown in Table 1.

<Number of Chip Flies in Cutting>

Using a "DFG-651" dicer manufactured by DISCO Corporation, cutting was performed under conditions of a speed of 40 mm/sec and a water amount in cutting of 1.5 L/min, adjusting the total amount of cuts of the pressure-sensitive adhesive layer and the base material to 90 μm using a resin blade (the number of revolutions: 38000 rpm, blade thickness: 300 μm). In this case, the number of flown chips with respect to 500 chips cut was confirmed. The results thereof are shown in Table 1.

<Pressure-Sensitive Adhesive Residue After Release>

After cutting, an ultraviolet ray of 20 nW/cm$^2$ was irradiated for 30 seconds from the base material side, using a high-pressure mercury lamp, thereby curing the pressure-sensitive adhesive layer. Then, it was cooled to room temperature, and the pressure-sensitive adhesive sheet was released by hand. For 500 chips, the presence or absence of an adhesive residue on a chip surface and laser-printed portion was confirmed using an optical microscope. The results thereof are shown in Table 1.

TABLE 1

| | | Example 1 | Example 2 | Comparative Example 1 | Comparative Example 2 |
|---|---|---|---|---|---|
| Unevenness Follow-Up Properties | Follow-Up Properties to Base material Surface | Good | Good | Good | Insufficient |
| | Follow-Up Properties to Laser-Printed Portion | Good | Good | Insufficient | Insufficient |
| Number of Chip Flies in Cutting | | 0 | 0 | 50 | 70 |
| Presence or Absence of Pressure-Sensitive Adhesive Residue | Pressure-Sensitive Adhesive Residue on Substrate Surface | Not generated | Not generated | Partially Generated | Partially Generated |
| | Pressure-Sensitive Adhesive Residue on Laser-Printed Portion | Not generated | Not generated | Partially Generated | Partially Generated |

While the present invention has been described in detail and with reference to specific embodiments thereof, it will be apparent to one skilled in the art that various changes and modifications can be made therein without departing from the scope thereof.

This application is based on Japanese patent application No. 2006-133234 filed on May 12, 2006, the entire contents thereof being hereby incorporated by reference.

Further, all references cited herein are incorporated in their entireties.

What is claimed is:

1. A pressure-sensitive adhesive sheet, which comprises:
a base material; and
a pressure-sensitive adhesive layer which is polymerizable and curable by an energy ray, said pressure-sensitive adhesive layer being disposed on a surface of the base material,
wherein the pressure-sensitive adhesive layer comprises:
an acrylic polymer,
a multifunctional acrylate oligomer which has an energy-ray polymerizable carbon-carbon double bond and has a molecular weight of 1000 to 2500, and
a multifunctional acrylate compound which has an energy-ray polymerizable carbon-carbon double bond and has a molecular weight of 200 to 700,
wherein said multifunctional acrylate oligomer is contained in an amount of 60 to 130 parts by weight, and said multifunctional acrylate compound is contained in an amount of 3 to 50 parts by weight, with respect to 100 parts by weight of the acrylic polymer.

2. The pressure-sensitive adhesive sheet according to claim 1, which is for use in processing a semiconductor wafer or semiconductor substrate.

3. The pressure-sensitive adhesive sheet according to claim 1, wherein said multifunctional acrylate oligomer is contained in an amount of 80 to 110 parts by weight, and said multifunctional acrylate compound is contained in an amount of 5 to 30 parts by weight, with respect to 100 parts by weight of the acrylic polymer.

4. The pressure-sensitive adhesive sheet according to claim 1, wherein the base polymer is an acrylic polymer having a weight-average molecular weight of from 300,000 to 1,000,000.

5. The pressure-sensitive adhesive sheet according to claim 1, wherein the multifunctional acrylate oligomer is a urethane acrylate oligomer.

6. The pressure-sensitive adhesive sheet according to claim 1, wherein the multifunctional acrylate compound is a multifunctional alkyl acrylate.

7. The pressure-sensitive adhesive sheet according to claim 1, which is used for adhering to a surface of a semiconductor wafer or substrate having a depression with a depth of 0.4 to 40 μm and cutting the semiconductor wafer or substrate.

8. A method for processing a semiconductor wafer or semiconductor substrate, which comprises:
adhering the pressure-sensitive adhesive sheet according to claim 1 to a surface of a semiconductor wafer or substrate; and
cutting the semiconductor wafer or substrate.

9. The method according to claim 8, wherein the semiconductor wafer or substrate has a depression with a depth of 0.4 to 40 μm.

* * * * *